United States Patent
Burkatovsky

(10) Patent No.: US 7,282,927 B1
(45) Date of Patent: Oct. 16, 2007

(54) USE OF A CONFIGURABLE ELECTRONIC CONTROLLER FOR CAPACITANCE MEASUREMENTS AND CABLE BREAK DETECTION

(75) Inventor: Vitaly Burkatovsky, Rishon le Zion (IL)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/472,230

(22) Filed: Jun. 21, 2006

(51) Int. Cl.
*G01R 27/26* (2006.01)
(52) U.S. Cl. ............... 324/667; 324/672; 324/658
(58) Field of Classification Search ............... 324/73.1, 324/658, 686, 667, 672
See application file for complete search history.

(56) References Cited

U.S. PATENT DOCUMENTS

| | | | |
|---|---|---|---|
| 5,014,238 A | 5/1991 | McLeish et al. | |
| 5,276,630 A | 1/1994 | Baldwin et al. | |
| 5,306,995 A | 4/1994 | Payne et al. | |
| 5,339,022 A | 8/1994 | Fleming et al. | |
| 5,412,291 A | 5/1995 | Payne et al. | |
| 5,493,650 A | 2/1996 | Reinke et al. | |
| 5,950,709 A | 9/1999 | Krueger et al. | |
| 6,181,140 B1 | 1/2001 | Vokey et al. | |
| 6,459,271 B1 | 10/2002 | Vokey et al. | |
| 6,646,454 B2 | 11/2003 | Watkins | |
| 6,739,145 B2 | 5/2004 | Bhatnagar | |
| 6,868,357 B2 | 3/2005 | Furse | |
| 2001/0015918 A1 | 8/2001 | Bhatnagar | |
| 2001/0039190 A1 | 11/2001 | Bhatnagar | |

FOREIGN PATENT DOCUMENTS

| | | |
|---|---|---|
| WO | WO91/02300 | 2/1991 |
| WO | WO 2002/037298 | 5/2002 |
| WO | WO 02/37298 A2 | 10/2002 |
| WO | WO 2005/029207 | 3/2005 |
| WO | WO 2006/008732 | 1/2006 |

*Primary Examiner*—Walter Benson

(57) ABSTRACT

A method and apparatus for measurement of capacitance by use of an adaptive input-cell circuitry, part of a configurable electronic controller, or generally by a computer controlled adaptive input-cell. The input-cell comprises a comparator, two transistor switches and resistor networks, respectively connected to the comparator and two switches. The input-cell receives control signals to the transistor switches and a synchronization waveform input from the configurable electronic controller or computer. The input-cell measures the capacitance connected at its input or alternatively the self-capacitance of an open conductor. The input-cell converts the input signal parameters into time-based signals, which cumulative count are related to the value of the measured capacitance.

12 Claims, 9 Drawing Sheets

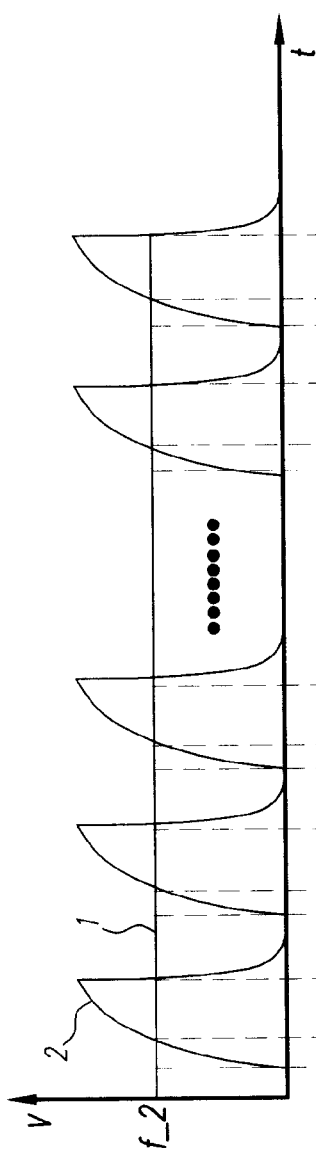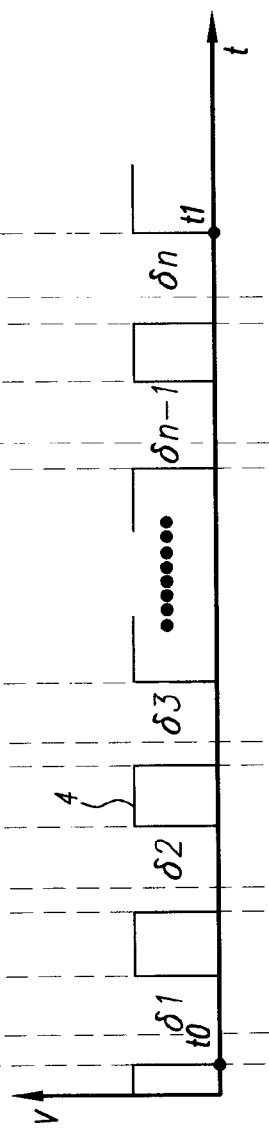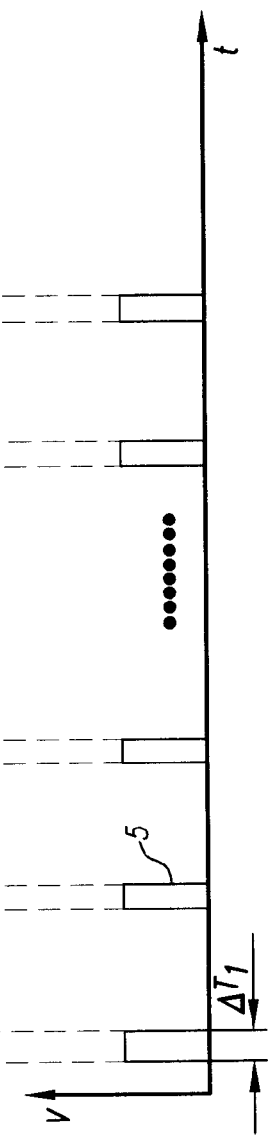
FIG. 5A
FIG. 5B
FIG. 5C

USE OF A CONFIGURABLE ELECTRONIC CONTROLLER FOR CAPACITANCE MEASUREMENTS AND CABLE BREAK DETECTION

CROSS REFERENCE TO RELATED APPLICATIONS

This application is related to U.S. Ser. No. 10/667,640, entitled CONFIGURABLE CONTROLLER, filed Sep. 22, 2003, and now U.S. Pat. No. 7,096,073 in the name of Vitaly Burkatovsky. This application is also related to U.S. Ser. No. 11/472,142, entitled AN ADAPTIVE INPUT-CELL CIRCUITRY USEFUL IN CONFIGURABLE ELECTRONIC CONTROLLERS, filed Jun. 21, 2006 in the name of Vitaly Burkatovsky, filed concurrently herewith.

FIELD AND BACKGROUND OF THE INVENTION

The present invention relates to apparatus and methods of capacitance measurements, in particular capacitive sensors and capacitance of cables connected to configurable electronic controllers useful in automotive and industrial automation.

Automotive and industrial electronic control systems use capacitive sensors for measurement of e.g., pressure, humidity and in-position sensing, liquid level, touch switches, and other control applications. For this purpose an electronic controller is preferably equipped with a capacitance-to-digital conversion module such as, for example, type AD7745 by Analog Devices. This circuitry is intended for capacitance measurements only and is not suitable for acquisition, by the same input, of another sensor type, for example voltage or current sensors.

A more flexible solution is the Sensor Signal Processor Chip type SSP1492 by Sensor Platforms Inc. This signal processor may be configured to accept capacitive, inductive or resistive sensor types, but each configuration is determined by external components, which cannot be changed in real time operation. In other words, in order to configure the signal acquisition of another sensor type the printed board components must be changed. This is quite problematic from the logistics and economical point of view.

The configurable electronic controller described in WO 2005/029207 (to V. Burkatovsky) is configured, by means of software commands, to perform measurements, on the same input pins, of different input signal parameters such as voltage, current and resistance as well as accept digital On-Off detectors. Another related invention described in WO 2006/008732 (V. Burkatovsky) describes means and method of input signal interconnect detection for such configurable electronic controllers.

It is one object of the present invention to provide a capacitance measurement technique for computerized control, and particularly controls based on configurable electronic controller architecture of the type described in the above-mentioned WO 2005/029207.

The field of electrical cable diagnostics is an important section in industrial and automotive control technology. Cables which are usually used, in such applications, have consistent geometry and may vary in length from dozens of centimeters to dozens of meters. Disconnections or damage resulting in cable breaks are considered a major failure in machine control, and impose on service personnel the use of special purpose tools to localize the failure for subsequent repair.

Diagnostics of breaks in cables is mentioned, for example, in the Infineon Current Sense TLE4990 data sheet (Clamping option). Tools for cable testing are described in, for example, in U.S. Pat. No. 6,868,357, utilizing the principles of Frequency Domain Reflectometry (FDR). Other devices as described in, for example, U.S. Pat. No. 6,646,454, U.S. Pat. No. 5,339,022, U.S. Pat. No. 5,493,650, and U.S. Pat. No. 6,181,140 determine cable length by measuring frequency/capacitance characteristics of the tested cable.

U.S. Pat. No. 6,459,271 describe a device for locating faults in a cable by applying a DC voltage step function to one end of the conductor, measuring the DC current into the conductor at the one end over a sampling period, integrating the DC current measured over the sampling period and computing the distance between the one end of the conductor to the open circuit fault by the integrated DC current and the known capacitance/unit length of the conductor.

These described devices are implemented as test and measurement tools with specific purposes of measuring the capacitance or cable length, as well as cable break detection and localization, and are not intended for machine control purposes.

It is another object of the present invention to provide a method for localizing breaks in wires and cables connected to electronic controllers, by capacitance measurement techniques based on configurable electronic controller architecture of the type described in above mentioned WO 2005/029207. In this method, the same controller will be able to accept signals of all kinds on its inputs, generate control signals on its outputs, and measure cable capacitance in order to detect and localize the cable breaks and perform harness diagnostics.

BRIEF SUMMARY OF THE PRESENT INVENTION

An object of certain embodiments is to provide a method, and also an apparatus, for measuring capacitance and particularly to measure capacitance of high and low values, by use of an adaptive input-cell. Another object of certain embodiments is to provide a method, based on capacitance measurements, to estimate the length of an open conductor. These and other objects, aspects, features, and advantages of the various embodiments of the present invention, will be more clearly understood and appreciated from a review of the following detailed description of the preferred embodiments, the drawings and the claims.

According to one aspect, an apparatus for measurement of capacitance by an input-cell is provided. The input-cell comprises: a comparator having a first input and a second input, the capacitance connected between the first input and a ground; a first resistor and a second resistor connected in series between a first voltage reference source and the first input; a first switch connected to the first resistor, the second resistor, and a ground, said first switch adapted to receive a first control signal from a first control line and to switch between an open state and a closed state in response to the first control signal with the first resistor, the second resistor and the first switch being adapted to provide charging and discharging of the capacitance when the first switch is open and closed respectively. A third resistor and a fourth resistor are connected in series between a second voltage reference source, a second switch and a waveform input line, the third and fourth resistors connected to the second input. The second switch is adapted to receive a second control signal from a second control line and to transition between an open state and a closed state based upon second control signal to switch the second input between the waveform input signal and a biased and attenuated waveform input signal when the second switch is open and closed respectively. A system clock is provided to synchronize at least the waveform input and first and second control signals, and the comparator is adapted to generate a signal at its output indicating whether an amplitude of a signal at the first input is greater than an amplitude of a signal at the second input.

In another aspect, there is provided a method for measurement of capacitance values, comprising the steps of providing a configurable input-cell, the input-cell comprising a comparator having a first input and a second input, the capacitance connected between the first input and a ground; a first resistor and a second resistor are connected in series between a first voltage reference source and the first input; a first switch connected to the first resistor, the second resistor and the ground; a third resistor and a fourth resistor connected in series between a second voltage reference source, a second switch and a waveform input line, the third resistor and the fourth resistor connected to the second input. Further method steps include: defining a first measurement configuration and a second measurement configuration of the input-cell by provision of a first control signal to the first switch and a second control signal to the second switch; providing a system clock to synchronize at least the waveform input and the first and second control signals; initiating, by the first control signal, at least one charge and discharge cycle of the capacitance; and measuring at least one of high capacitance values and low capacitance values by the first and second measurement configurations. The output signal of the comparator, as measured by a cumulative count of the system clock, is indicative of the value of the capacitance.

According to yet another aspect, there is provided a configurable controller comprising a system clock, a synchronization control module; a plurality of configurable signal acquisition modules connected with the synchronization control module; a control logic connected with the plurality of signal acquisition modules; a plurality of input-cells respectively connected with the plurality of signal acquisition modules and with a respective plurality of input pins; a synchronization signal generator connected with the synchronization control module and with the plurality of input-cells, wherein each one of the plurality of input-cells is operable to convert input signal parameters to time based parameters; and wherein each of the signal acquisition modules is configured to convert the time-based parameters into a digital form. The input-cell comprises: a comparator having a first input and a second input, the first input connected to the input pin, and an output signal connected to the signal acquisition module; at least one of a sensor output signal and a capacitance connected to the input pin; a first transistor switch and a second transistor switch; resistor networks respectively connected the first input and second input of the comparator, and to the first and second transistor switches, wherein the first transistor switch can be configured by the signal acquisition module to form one of a pull-up and a pull-down for the sensor output signal received at the input pin; and wherein the first transistor switch can be configured by the signal acquisition module to initiate at least one charge and discharge cycle of the capacitance. Wherein the second transistor switch can be configured by the signal acquisition module to connect the second input to one of a second voltage reference source and an input waveform from the synchronization signal generator; and wherein the generated output signal of the comparator is indicative of at least one of the sensor output signal and the value of the capacitance.

According to still another aspect, there is provided a method of acquiring a plurality of signals and measuring capacitance comprising the steps of: providing a system clock, a synchronization control module, configuring a plurality of configurable signal acquisition modules connected with the synchronization control module, providing a control logic connected with the plurality of signal acquisition modules, providing a plurality of input-cells respectively connected with the plurality of signal acquisition modules, providing a synchronization signal generator connected with the plurality of input-cells, acquiring input signals from sensors and charged capacitance, the input signals acquired by one of the plurality of input-cells, converting the acquired input signals into a plurality of time-based parameters, converting the plurality of time-based parameters into a digital form. Converting the acquired input signal parameters into a plurality of time-based parameters is controlled by a first and second transistor switches comprised in the input-cells.

BRIEF DESCRIPTION OF THE DRAWINGS

The invention is herein described, by way of example only, with preference to the accompanying drawings, wherein:

FIGS. 5A-5C represent timing diagrams of the signals involved in a preferred embodiment and measurement procedure of low capacitance values;

DESCRIPTION OF PREFERRED EMBODIMENTS

The preferred embodiments of the invention will be described in reference to the architecture of a configurable electronic controller and particularly of the adaptive input-cell as described in U.S. Ser. No. 11/472,142, entitled AN ADAPTIVE INPUT-CELL CIRCUITRY USEFUL IN CONFIGURABLE ELECTRONIC CONTROLLERS in the name of Vitaly Burkatovsky, filed concurrently herewith.

Figure 1:
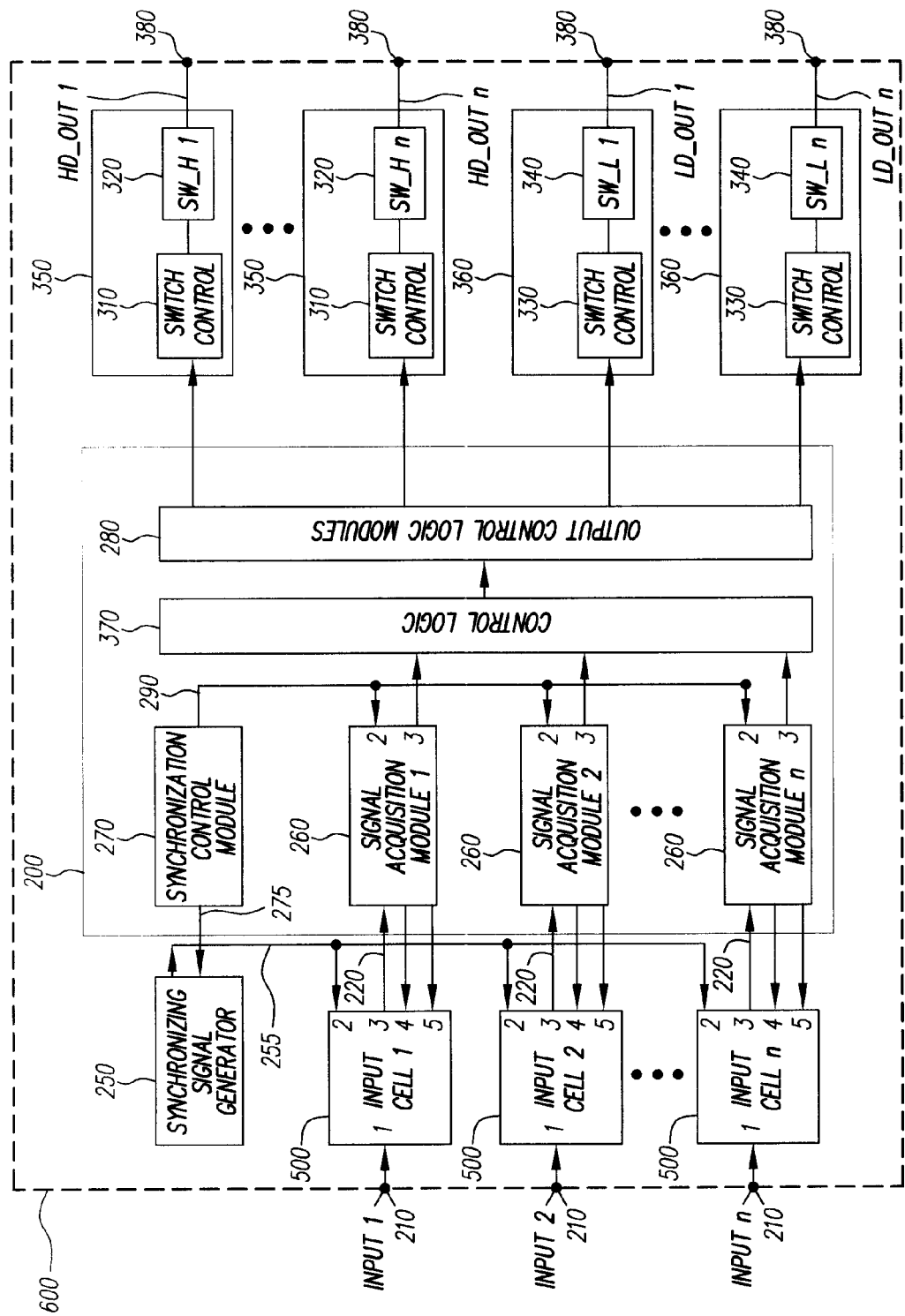
FIG. 1 is a schematic block-diagram of an electronic controller including an adaptive input-cell circuitry, used in the present invention.

The preferred embodiments of capacitance measurements are based on the architecture in FIG. 1, which is generally similar to the architecture described in FIG. 3 of the above-mentioned U.S. Ser. No. 11/472,142.

Specifically, FIG. 1 is a general block diagram of one embodiment of a configurable control system 600 that uses a plurality of adaptive input-cells 500. Configurable control system 600 is substantially similar to the controller illustrated in FIG. 3 of WO 2005/029207, except for the adaptive input-cell 500, which replaces the original basic input-cell 240. Configurable control system 600 comprises a synchronizing signal generator 250, configurable digital unit 200, such as FPGA or CPLD, which comprises at least synchronization control module 270, control logic module 370, a number of signal acquisition modules 260, configured to accept signals coming from input pins 210 of configurable control system 600 through adaptive input-cells 500. Adaptive input-cells 500 can be identical or can vary.

Output control logic modules 280 can be configured to provide control of the loads connected to the output pins 380 of configurable control system 600, through high-side output drivers 350 and/or low-side output drivers 360. In this embodiment, such high-side output drivers 350 each have a high-side switch control 310 and high-side switch 320, while such low-side output drivers 360 each have a low-side switch control 330 and low-side switch 340.

The synchronization control module 270 of configurable control system 600 is configured to generate basic time-dependent signals, in order to synchronize the work of the adaptive input-cells 500 and signal acquisition modules 260. Such synchronization is needed for conversion of input signal values to time-based parameter, (e.g. pulse width, delay, duty cycle, frequency, etc.) by adaptive input-cells 500, and then for converting these time-based parameters to digital form by means of configured signal acquisition modules 260. One possible implementation of synchronization control module 270 may be, for example, a counter, which counts incoming pulses with constant interval between them. The sequence of such pulses can be obtained from the system clock, for example. The output reference data 290 of synchronization control module 270 is connected to each of the signal acquisition modules 260 and also to synchronizing signal generator 250 as a sync data 275. Synchronizing signal generator 250 is implemented, for example, as a digital to analogue converter. Synchronization control module 270 is connected to each of the signal acquisition modules 260 and also to synchronizing signal generator 250 as a sync data 275. While synchronization control module 270 is running, the value of the sync data 275, which is equal to output reference data 290, is periodically changed from 0 to its maximum value, which causes a saw-teeth shape synchronization signal Vsync on the synchronization input 255 of synchronizing signal generator 250. This voltage is transferred to the second input of adaptive input-cells 500. The first input of the adaptive input-cells 500 is connected to the corresponding input pin of configurable control system 600 respectively. The output signal of adaptive input-cell 500 is connected to the input of corresponding signal acquisition module 260. The implementation of configurable signal acquisition modules 260 may vary according to the type of signal that needs to be accepted and thus supports the different peripheral environments.

The function of adaptive input-cells 500 will be demonstrated by analyzing the signal acquisition method related to a range of exemplary sensor families.

Figure 2:
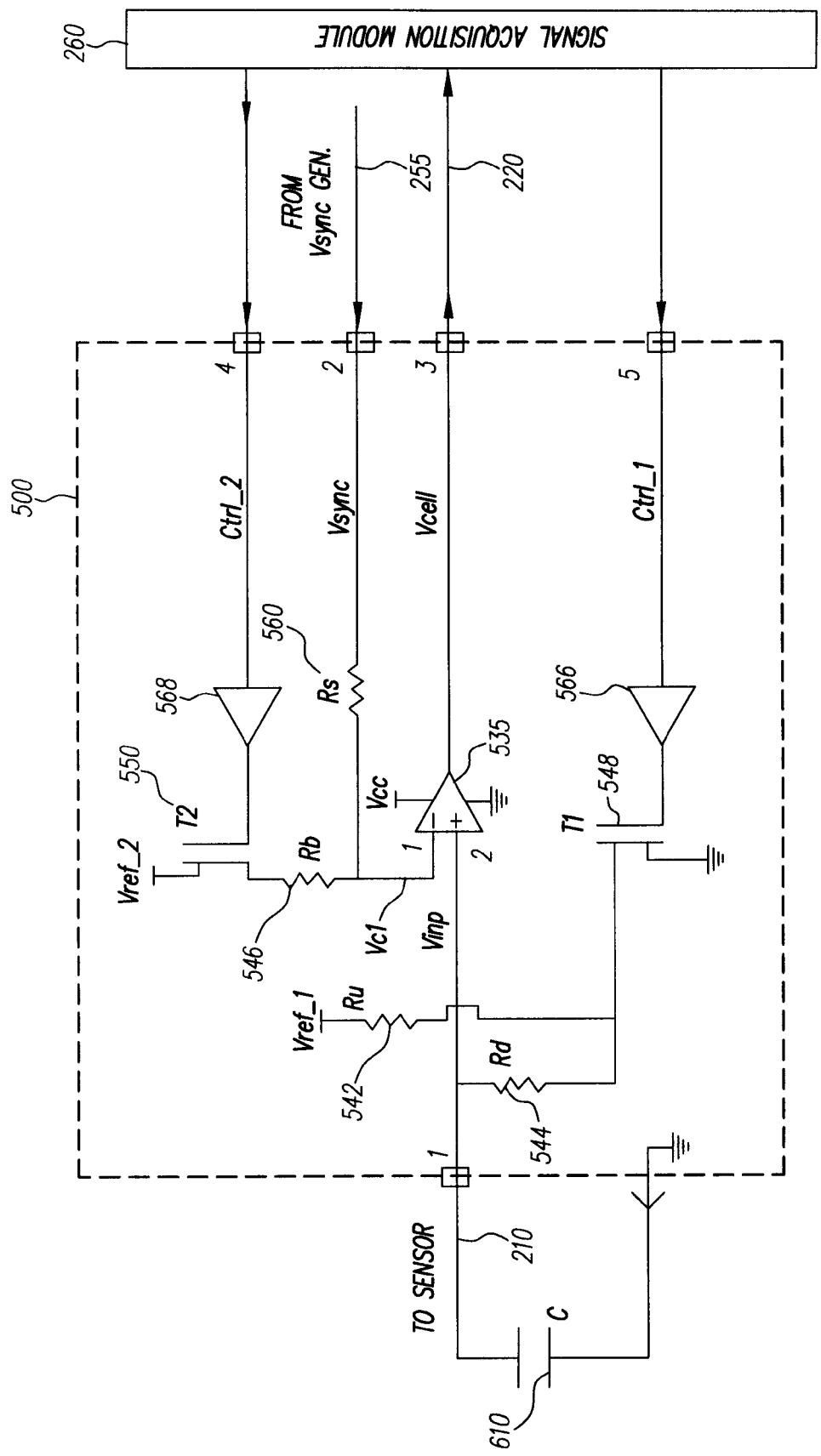
FIG. 2 is a schematic drawing of an adaptive input-cell circuitry, used in the present invention.

In FIG. 2, a capacitor 610 is connected to leg 1 of adaptive input-cell 500. Input voltage Vinp at input pin 210 is fed into adaptive input-cell 500 and is identical to the voltage across capacitor 610.

The architecture of adaptive input-cell 500 is adapted to implement a number of methods for capacitance measurement. Each of these methods is optimal for a specific range of capacitance values. For the purpose of the preferred embodiments of the invention described below, two capacitance ranges are defined: a low capacitance range as being below 500 nF, and a high capacitance range as being higher than 200 nF. The overlap of capacitance values in these two ranges means that the capacitance within the range of 200 nF to 500 nF can be measured by any of the suggested methods without substantial loss of accuracy.

Two configurations of the adaptive input-cell 500 in FIG. 2, that are useful for the preferred embodiments to be described hereinafter, will now be detailed. For the purpose of the discussion, and as a non-limiting example, first electromagnetically controlled switch 548 is shown as a N-Ch FET transistor T1 and second electromagnetically controlled switch 550 is shown as a P-Ch FET transistor T2. As will be seen below, the configuration of adaptive input-cell 500 is determined based upon the signals provided to first and second electromagnetically controlled switches 548 and 550 respectively.

It will be appreciated that, in other embodiments, first electromagnetically controlled switch 548 or second electromagnetically controlled switch 550 can comprise any switch that can transition from a state that does not conduct electricity to a state that does conduct electricity in response to an electrical signal, an optical signal, or a magnetic signal can, for example, take an electromagnetically controlled form including, but not limited to, a relay, an opto-coupler, a current controlled switch, a voltage controlled switch or a P-channel field effect transistor. Further, it will be appreciated that the cited resistance values are exemplary only and that other values can be used that achieve results that are consistent with the functionality described herein and that the selection of such other values is within the scope of one of ordinary skill in the art in view of the teachings herein.

As is also shown in FIG. 2, optional buffers 566 and 568 can be provided to protect against the transmission of unanticipated or unwanted electromagnetic pulses.

The first measurement configuration of adaptive input-cell 500 is provided by applying a Logic Low signal to terminal 4 of the cell. In this case second electromagnetically controlled switch 550 is closed and voltage reference Vref_2 is applied through resistor Rb 546 to the first input of comparator 535; voltage applied to the first input of comparator 535 is designated as Vc1. Resistor Rb 546 should be low, for example, Rb<200Ω and resistor Rs 560 should be high—several kilohms to hundreds of kilohms—to ensure a low ripple of synchronization input 255 on Vc1. The first configuration of adaptive input-cell 500 represents, as will be further explained, a scheme including capacitor 610, resistors Ru 542 and Rd 544, voltage reference Vref_1 and first electromagnetically controlled switch 548 for comparison of input voltage Vinp at input pin 210, with a predetermined threshold Vc1.

The second measurement configuration of adaptive input-cell 500 is provided by applying a logic High signal to terminal 4 of the cell. In this case second electromagnetically controlled switch 550 is open and synchronization signal Vsync from synchronization input 255 is applied to the first input of comparator 535 through the resistor Rs 560. Due to the low input current of comparator 535 the voltage drop on resistor Rs 560 is negligible and Vc1 is practically equal to the synchronization signal Vsync.

The second configuration of adaptive input-cell 500 represents, as will be further explained, a scheme for comparison of input voltage Vinp at input pin 210 with the controller generated synchronization signal Vsync applied to synchronization input 255. Comparator 535 then provides an output that indicates whether an amplitude of input voltage Vinp is greater than an amplitude of synchronization voltage Vsync.

Figure 3A:
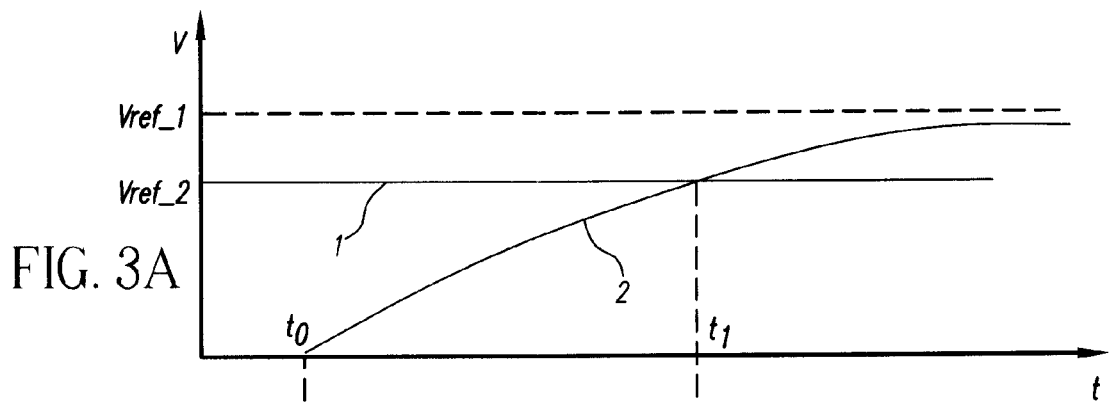
FIGS. 3A-3C represent timing diagrams of the signals involved in a preferred embodiment and measurement procedure of high capacitance values.
Figure 3B:
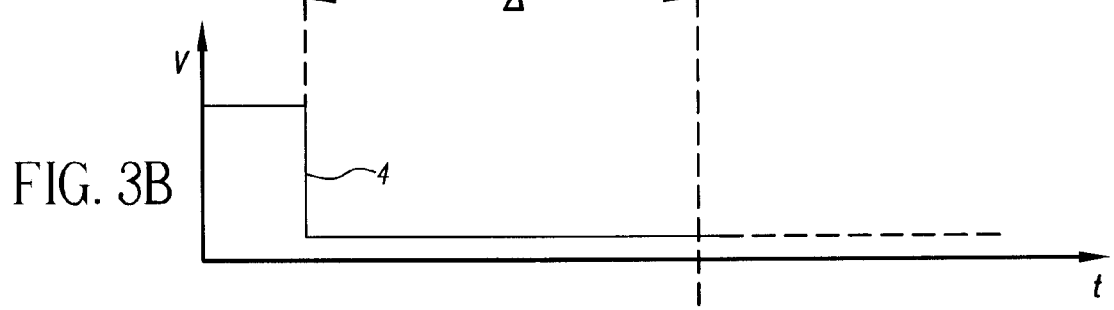
Figure 3C:
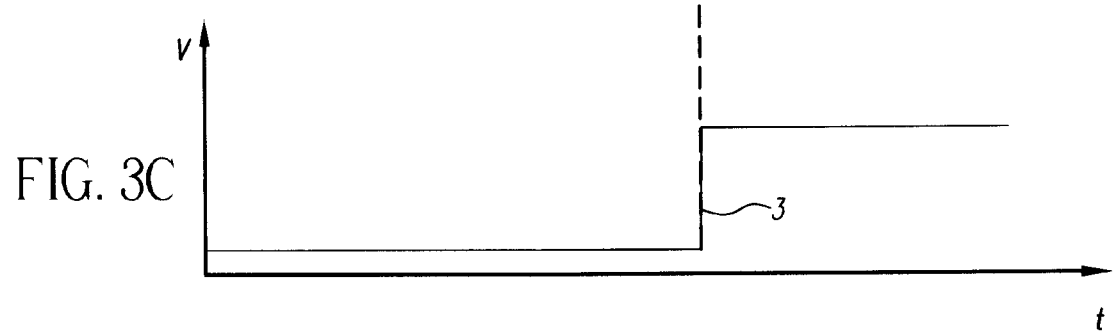

Preferred Embodiments for Measuring High Capacitance Values:

The method of high capacitance measurement is implemented by using the first configuration of adaptive input-cell 500. FIGS. 3A-3C represent timing diagrams of the signals involved in the measurement procedure. The status of control signals applied to the adaptive input-cell 500 prior to starting measurements (t=t0) should be: Ctrl_1 at leg 5 (curve 4 of FIG. 3B)—Logic High; Ctrl_2 at leg 4 (not shown in FIG. 3) is permanently at Logic Low, and Vsync has, as stated, minimal impact on the measurement process according to this first configuration. The Logic High level of Ctrl_1 keeps first electromagnetically controlled switch 548 closed, which grounds terminal 1 of adaptive input-cell 500 through the resistor Rd. The input voltage Vinp to comparator 535 (Curve 2) is, in this state, equal to zero.

It is further assumed that Vref_2<Vref_1.

To start measurements: Crl_1 falls at t=t0 to Logic Low, shutting off first electromagnetically controlled switch 548 while current from voltage reference Vref_1 begins to charge the capacitor 610 through resistors Ru 542 and Rd 544. At t=t1 input voltage Vinp reaches the level of Vc1≅Vref_2 (curve 1 in FIG. 3A) and comparator 535 changes its output level (Vcell–Curve 3) from Logic Low to High. The related signal acquisition module 260 (of FIG. 1) is configured to perform the function of system clock counting from t to t1. The dependence between the measured capacitance C and system clock number N, counted for period of measurements Δt, will be shown hereinafter.

Voltage $V_{inp}$ on capacitor 610, charging through the resistors Ru 542 and Rd 544 may be described by following equation:

$$V_{inp} = V_M \times \left(1 - e^{\left(-\frac{t}{\tau}\right)}\right) \quad (1)$$

Where
$V_M$—is the voltage reference Vref_1
t—Time of charging
τ—Time constant

For the charging scheme shown in FIG. 2, the time constant τ will be determined by the measured capacitance C of capacitor 610 and resistors Ru 542 and Rd 544. The resistance of open first electromagnetically controlled switch 548 is negligible.

$$\tau = (Ru + Rd) \times C \quad (2)$$

At time t1, when the charging of capacitor 610 reaches the predetermined threshold voltage Vth, in this case Vth=Vref_2; equation (1) will be:

$$V_{th} = V_M \times \left(1 - e^{-\frac{t_1}{\tau}}\right) \quad (3)$$

Now substituting of equation (2) into equation (3) and solving for C gives:

$$C = \frac{t_1}{(Rd + Ru) \times \ln\left(\frac{V_M}{V_M + Vth}\right)} \quad (4)$$

As the period of measurements Δt equals t1 (t0=0), t1 can be replaced by the number N of system clock periods Tsc, as counted during Δt:

$$t1 = N \times Tsc \quad (5)$$

defining:

$$\varphi = \frac{V_{th}}{V_M} \quad (6)$$

We get a more convenient form of equation:

$$C = \frac{N \times T_{SC}}{(Rd + Ru) \times \ln\left(\frac{1}{1+\varphi}\right)} \quad (7)$$

Or:

$$C = N \times K \quad (8)$$

Where K is constant:

$$K = \frac{T_{SC}}{(Rd + Ru) \times \ln\left(\frac{1}{1+\varphi}\right)} \quad (9)$$

Or:

$$K = \frac{1}{f_s \times (Rd + Ru) \times \ln\left(\frac{1}{1+\varphi}\right)} \quad (10)$$

Where fs is the system clock frequency.

Conclusion—The number of system clocks N, counted by the signal acquisition module 260 is proportional to the measured capacitance and may be used for capacitance value calculation.

Figures 4A, 4B, 4C:
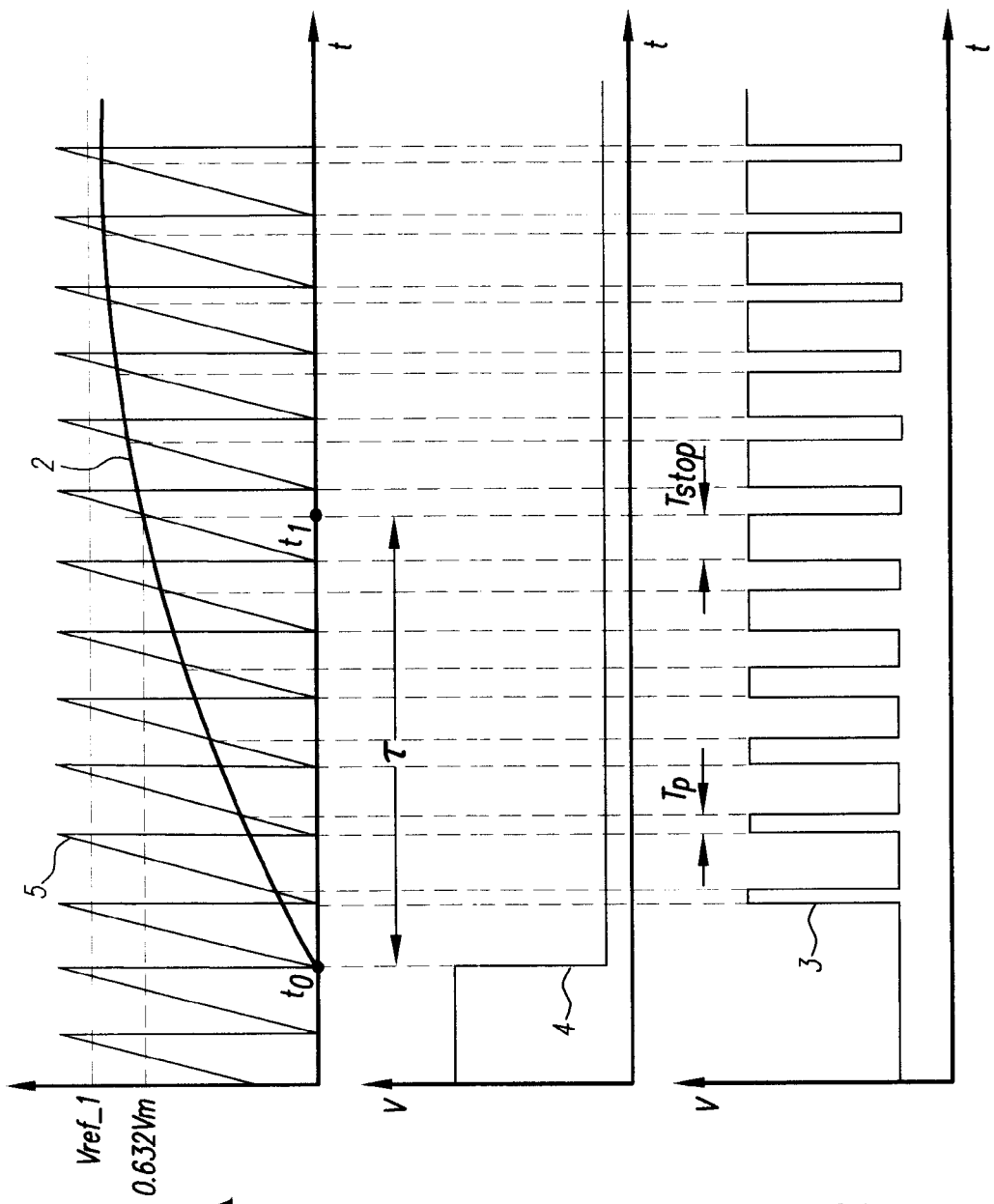
FIGS. 4A-4C represent timing diagrams of the signals involved in another preferred embodiment and measurement procedure of high capacitance values.

Another embodiment of high capacitance value measurements is implemented by using the second configuration of adaptive input-cell 500. FIGS. 4A-4C represent timing diagrams of the signals discussed hereinafter during the measurement process.

The logic High Ctrl_2 signal to second electromagnetically controlled switch 550 will disconnect voltage reference Vref_2 from resistor Rb 546 and comparator 535. This allows the synchronization voltage Vsync at synchronization input 255 to be applied through the resistor Rs 560 to input 1 of comparator 535. This voltage will be designated as Vc1 and is shown in FIG. 4A as curve 5. The voltage on capacitor 610 (curve 2) and start of measuring signal to first electromagnetically controlled switch 548 (curve 4, FIG. 4B) are the same as previously described.

To start measurement signal Ctrl_1 falls to logic Low in coincidence with the beginning of synchronization input 255 cycle. The logic Low Ctrl_1 signal turns off first electromagnetically controlled switch 548 and starts the charging process of capacitor 610 (curve 2). The output voltage Vcell, of comparator 535 provided at output pin 220, will be illustrated at curve 3 of FIG. 4C, and will be represented by a series of pulses with period Tp which is proportional to the voltage on capacitor 610.

In the method of high capacitance measurement of this embodiment, the number N of system clocks are counted during the time the measured capacitor is charging until the moment when the width Tp generated by input-cell pulses, as shown in FIG. 4C, reaches the predetermined value Tstop. In order to simplify the calculation of the measured capacitance, Tstop should be determined as a pulse width corresponding to the charged capacitor voltage equaling to 0.632 Vref_1, as shown in FIG. 4A.

In this case, charging time will be equal to the time constant τ as shown in FIG. 4A. Accordingly, and by using of equations (2) and (5), the measured capacitance may be found by the following equation:

$$C = \frac{N \times T_{SC}}{Rd + Ru} \tag{11}$$

The signal acquisition module 260 starts system clocks counting at t0 triggered by the falling edge of Ctrl_1 signal (curve 4 of FIG. 4B) and finishes counting when Tp reaches the Tstop value:

$$T_p \cong T_{stop}$$

In general Tstop may be predetermined as Tp corresponding to a threshold voltage Vth which might be different from 0632 Vref_1. In this case the capacitance value should be determined by equations (6) and (7).

Measuring Low Capacitance Values:

The measurements of low capacitance values is important for example in industrial control for capacitive sensors, capacitance touch switches or cable capacitance measurements. The following methods of low capacitance measurement are based on the use of the configurable controller of FIG. 1.

One embodiment is based on the first configuration of adaptive input-cell 500. FIGS. 5A-5C represent timing diagrams of the signals involved in this measurement procedure.

The pre-measurement (t<t0) status of the control signals to first and second electromagnetically controlled switches 548 and 550, respectively, is similar to the one described re FIG. 3.

To perform measurements of low capacitance values, the signal acquisition module 260 starts generating Ctrl_1 pulses, as shown in curve 4 of FIG. 5B, wherein the logic Low state enables charging of capacitor 610 through the resistors Ru 542, Rd 544, and logic High states cause the discharge of capacitor 610 through resistor Rd 544. The number δ of charge-discharge cycles is predetermined at any suitable value.

System clocks are counted by signal acquisition module 260 for each capacitor charge cycle from the beginning of the charge cycle to the equality point of capacitor voltage Vinp (curve 2 of FIG. 5A) with threshold voltage Vc1≅Vref_2 (curve 1 of FIG. 5A). The count enable signals at the output of comparator 535 to signal acquisition module 260 are represented by curve 5 of FIG. 5C. Sequential summing of counted clocks is done up to the end of predetermined last cycle number δ. The capacitance value of capacitor 610 for each charge cycle may be found by use of equation (7).

Multiplying by δ both left and right parts of equation (7) we get:

$$C \times \delta = \frac{\delta \times N \times T_{SC}}{(Rd + Ru) \times \ln\left(\frac{1}{1+\varphi}\right)} \tag{12}$$

The (δ×N) expression represents the sum of system clock periods counted for each count enable interval Δt over δ cycles.

Thus, the equation for calculating capacitance of capacitor 610 in this case will be:

$$C = \frac{\sum_{i=1}^{\delta} N_{(i)} \times T_{SC}}{\delta \times (Rd + Ru) \times \ln\left(\frac{1}{1+\varphi}\right)} \tag{13}$$

One advantage of the configurable controller of FIG. 1 is its ability to change or combine the functionality of any of its input pins. Capacitance measurement is a good example: an input pin 210 of configurable control system 600 of FIG. 1 is allocated, as an example, to an analogue detector signal received from a remote sensor via a cable. In addition, the configurable controller is required to locate, in case of need, cable disconnection points. This task can be achieved by measurement of the self-capacitance of the "open" cable. If, for acquisition of the analogue detector signal, the second configuration of adaptive input-cell 500 is used, then, for the purpose of simplicity, it is preferable to use the second input-cell configuration also for capacity measurement. Such a method is described hereinafter as another embodiment, where the timing diagrams, representing the functionality of the described method, are shown on FIG. 6 to FIG. 9.

Figure 6A:
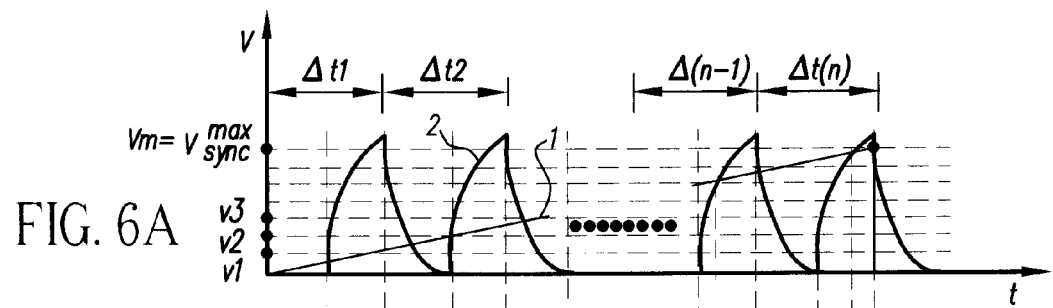
FIGS. 6A-6C represent timing diagrams of the signals involved in another preferred embodiment and measurement procedure of low capacitance values.
Figure 6B:
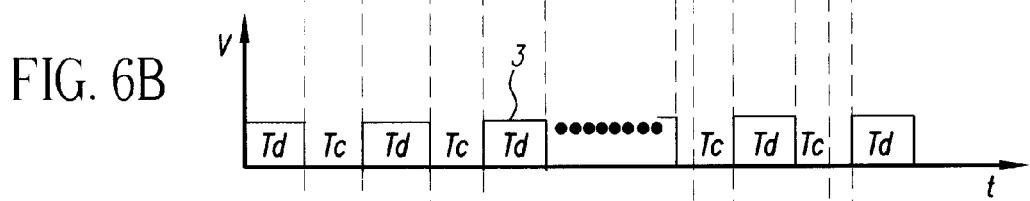
Figure 6C:
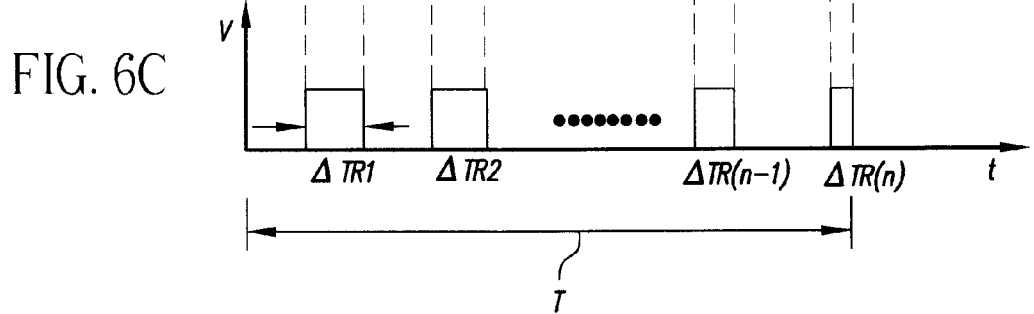

To perform measurements of low capacitor 610 using the second input-cell configuration, signal acquisition module 260 starts to generate Ctrl_1 signals in form of a sequence of equal pulses Td separated by equal pause intervals Tc, as shown in curve 3 of FIG. 6B. As explained in the first embodiment above, the signal of curve 3 results in charging and discharging of measured capacitance of capacitor 610 as shown by curve 2 of FIG. 6A. The ratio between the period T of Vsync, shown schematically by curve 1 of FIG. 6A, and period of the capacitance charging cycle must be an integer value, meaning that the ramp period of Vsync should be divided into a predetermined number of equal charge-discharge cycles.

Figure 7:
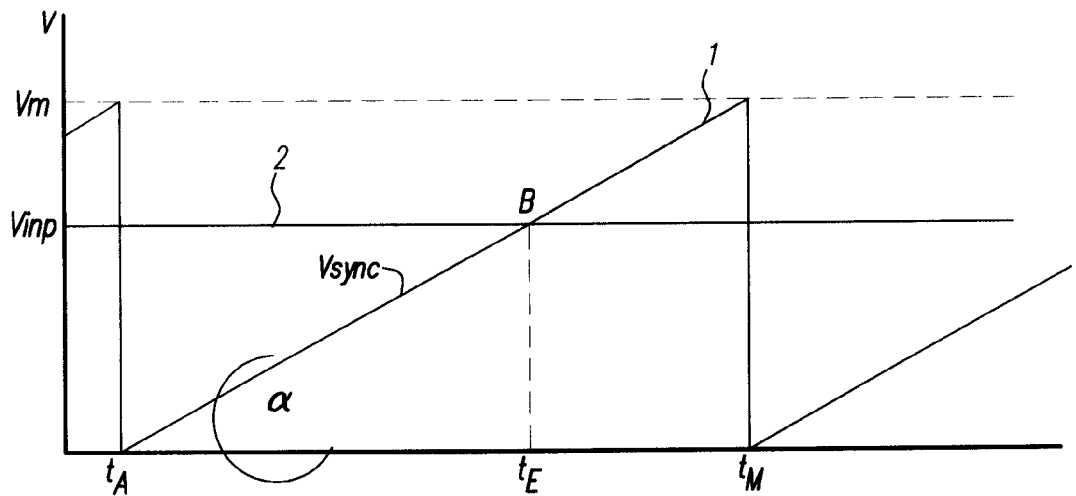
FIG. 7 shows the signals on both inputs of comparator 535 operating in the preferred embodiment also represented by FIG. 6A.

FIG. 7 shows the signals on both inputs of comparator 535 operating in the second configuration of adaptive input-cell 500. In FIG. 7, (as in FIG. 6A), synchronization voltage Vsync is represented by curve 1 and input voltage Vinp is represented schematically by curve 2. For the purpose of the explanation it is assumed that measured input voltage Vinp (curve 2) is practically constant within the period of synchronization voltage Vsync.

Based on the explanations in WO 2005/029207 the time $t_{EA}$ from the beginning cycle of synchronization voltage (Vsync=0) to the moment when Vsync equals Vinp—is proportional to the input voltage Vinp:

$$t_{EA} = t_E - t_A = V_{inp} \times \frac{1}{tg(\alpha)}, \tag{14}$$

Where α is the slope angle of Vsync.

This interval may be measured by counting the number of system clocks N within $t_{EA}$ by means of a counter configured in signal acquisition module 260.

Thus, $t_{EA}$ may be expressed as:

$$t_{EA} = N \times T_{sc}, \tag{15}$$

Where N is the number of system clocks counted for the time $t_{EA}$, and Tsc—system clock period, by comparing equations (14) and (15) we get:

$$V_{inp} = N \times T_{sc} \times tg(\alpha), \tag{16}$$

In FIG. 6A a practical timing diagram is shown, using the same notations as in the conceptual diagram of FIG. 7. Curve 1 is the synchronization voltage Vsync signal, and Curve 2 describes the repetitive charge-discharge of capacitor 610, as dictated by the Ctrl_1 signal (curve 3) shown in FIG. 6B. Low capacitance value measurement is based on counting and subsequent summing of system clocks during the variable periods of time $\Delta TR(n)$, shown in FIG. 6C. $\Delta TR(n)$, represents the time interval between the crossover of input voltage Vinp, representing the charging curve 2 of capacitor 610, and the synchronization voltage Vsync represented by curve 1, and the beginning of each discharge cycle dictated by the rising edge of pulse train of curve 3.

In addition, as depicted in FIG. 6A, the period T of synchronization voltage Vsync consists of n equal discharge and charge periods Td-Tc, resulting in n intervals $\Delta tRn$ (curve 4). The range of input voltage measurements 0 to $V_{sync}^{max}$ is divided into n equal parts. The value of such part may be written as:

$$\Delta V = V_1 - V_0 = V_2 - V_1 = \ldots = V_n - V_{n-1} = \frac{V_{sync}^{max}}{n} \quad (17)$$

The dependence of the measured capacitance C on the clock count sum value is described below.

By definition, the capacitor charging current I(t) will be:

$$I(t) = \frac{dQ(t)}{dt}, \quad (18)$$

Where Q(t) is the electrical charge of the capacitor.

The expression for electrical charge QT at the specific time T derived as:

$$Q_T = \int_0^T I(t)\,dt \quad (19)$$

For practical purposes the integration may be replaced by Riemann Sum, representing the integration area by sum of areas of rectangles:

$$Q_T \cong \sum_{i=0}^{n} I(t_i)\Delta t_i \quad (20)$$

Due to the fact that the described method entails the division of each charging period into the n equal parts, the $Q_T$ may be expressed as:

$$Q_T \cong \Delta t_i \sum_{i=0}^{n} I(t_i) \quad (21)$$

Or $$Q_T \cong \frac{T}{n}\sum_{i=0}^{n} I(t_i) \quad (22)$$

where:
T—period of measurements, and
n—number of measurements.

Each measurement of I(ti) may be defined from Ohms law:

$$I(t_i) = \frac{V_i^R}{R_U + R_D} \quad (23)$$

where:
$V_i^R$—voltage on pull-up resistors Ru 542 and Rd 544.

Figure 9:
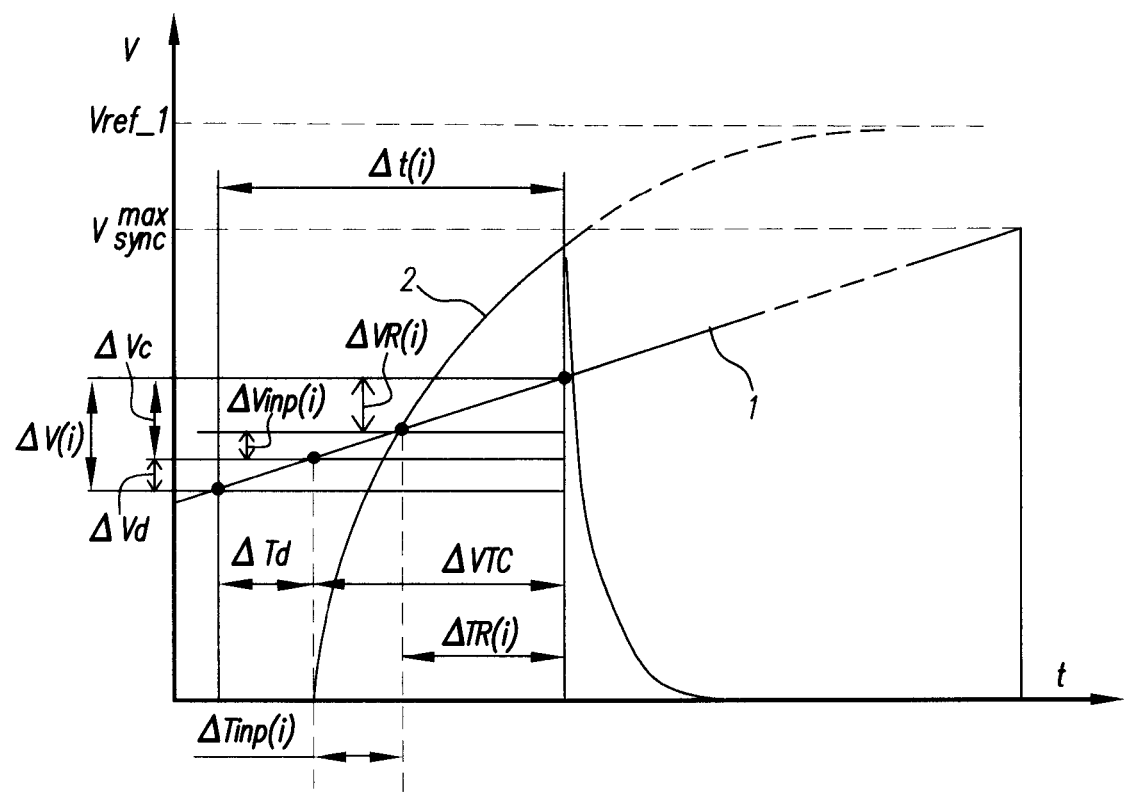
FIG. 9 is another timing diagram related to FIG. 6A.

FIG. 9 demonstrates one of the charge-discharge cycles of the capacitor 610, represented by curve 2 (shown also in FIG. 6A, curve 1).

By way of further description, FIG. 9 depicts a more detailed view of the measurement area for a single discharge-charge cycle 2, of capacitor 610 as first shown in FIG. 6A. In FIG. 9, curve 2 is the discharge-charge-cycle and curve 1 represents $V_{sync}$. $V_{sync}^{max}$ is the maximum measurable input voltage, represented by $V_{inp}^{max}$. The discussed measurement area is restricted by the border of the interval $\Delta t(i)$ and voltage $\Delta V(i)$ as determined in equation (17). Discharge time is defined as $\Delta Td$ and the respective change of $V_{sync}$ for this time interval is defined as $\Delta Vd$. Similarly: the change of $V_{sync}$ during the charging part of the cycle $\Delta Tc$ is defined as $\Delta Vc$. $\Delta Vc$ may be represented as:

$$\Delta V_c = \Delta V_{inp(i)} + \Delta V_{R(i)} \quad (24)$$

where:
$\Delta Vinp(i)$ and $\Delta VR(i)$ are the voltage changes of Vsync from the start of the charge to the crossover point of Vinp and Vsync (Interval $\Delta Tinp(i)$), and from this crossover point to the end of the charge respectively (Interval $\Delta TR(i)$).

For the every Vinp and Vsync crossover point of time the voltage drop on the resistors Ru 542, Rd 544 will be:

$$V_i^R = V_{ref\_1} - V_{inp(i)} \quad (25)$$

By using above definitions for the first discharge-charge cycle we get:

$$V_1^R = V_{ref\_1} - \Delta V_d - \Delta V_{inp1} \quad (26)$$

For the second cycle:

$$V_2^R = V_{ref\_1} - \Delta V_d - \Delta V_{inp2} - \Delta V_1 \quad (27)$$

For cycle (n):

$$V_n^R = V_{ref\_1} - \Delta V_d - \Delta V_{inp(n)} - \Delta V \times (n-1) \quad (28)$$

Defining the constant value $V_{ref\_1} - \Delta V_{sync}^{max}$ as $\psi$ and $\Psi$ considering equation (17) we get:

$$V_n^R = \Psi + V_{sync}^{max} - \Delta V_d - \Delta V_{inp(n)} - \Delta V \times (n-1) \quad (29)$$

$$V_n^R = \Psi + V_{sync}^{max} - \Delta V_d - \Delta V_{inp(n)} - V_{sync}^{max} \times \frac{(n-1)}{n} \quad (30)$$

$$V_n^R = \Psi + \frac{V_{sync}^{max}}{n} - \Delta V_d - \Delta V_{inp(n)} \quad (31)$$

$$V_n^R = \Psi - \Delta V_d + \frac{V_{sync}^{max}}{n} - \Delta V_{inp(n)} \quad (32)$$

Using the definitions from the FIG. 9, $V_n^R$ may be represented as:

$$V_n^R = \Psi - \Delta V_d + \Delta V_{R(n)} \quad (33)$$

or $V_n^R = \Psi_d + \Delta V_{R(n)} \quad (34)$ where $\Psi_d = \Psi - \Delta V_d$ is a known and not changeable voltage.

Now considering equation (23) the equation (34) may be written as:

$$I(t_i) = \frac{\Psi_d + \Delta V_{R(i)}}{R_U + R_D} \quad (35)$$

Figure 8:
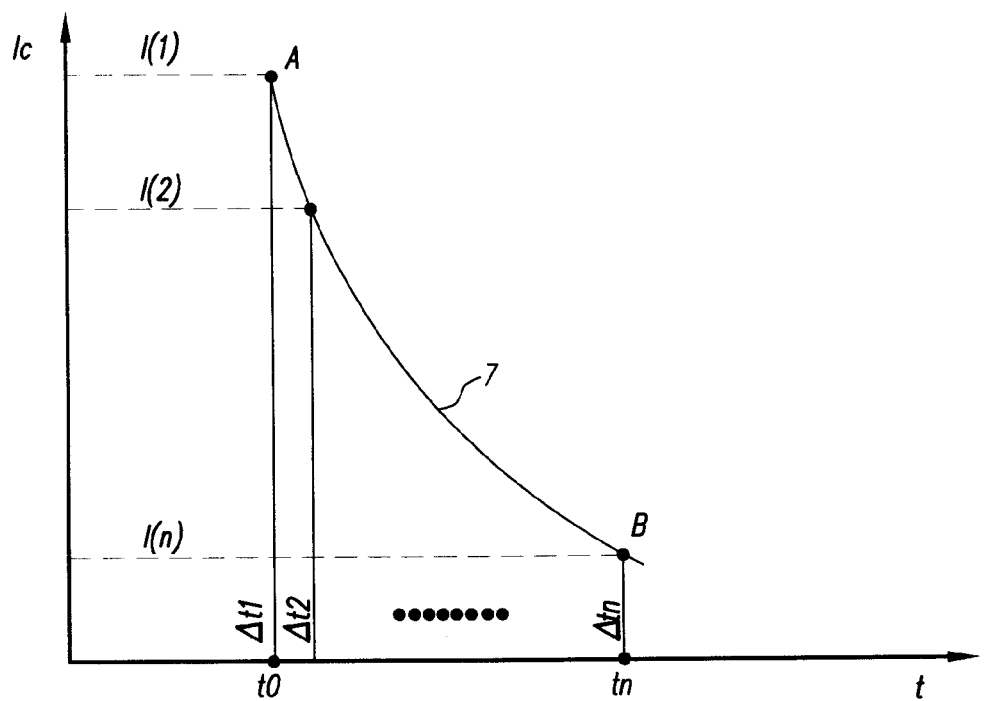
FIG. 8 shows the total charge measured during period T, as explained re FIGS. 6A-6C.

Charge currents measured during each charge cycle (i) are shown in FIG. 8.

Based on equation (16), equation (35) may be transformed into:

$$I(t_i) = \frac{T_{sc} \times tg(\alpha) \times (N_d + \Delta N_{R(i)})}{R_U + R_D} \quad (36)$$

And by substituting of equation (36) to equation (22) we get:

$$Q_T \cong \frac{T}{n} \sum_{i=0}^{n} \frac{T_{sc} \times tg(\alpha) \times (N_{R(i)} + N_d)}{R_U + R_D} \quad (37)$$

Or:

$$Q_T \cong \frac{T \times T_{sc} \times tg(\alpha)}{n \times (R_U + R_D)} \sum_{i=1}^{n} (N_{R(i)} + N_d) \quad (38)$$

And after transformation:

$$Q_T \cong \frac{T \times T_{sc} tg(\alpha)}{n \times (R_U + R_D)} \sum_{i=1}^{n} (N_{R(i)}) + \frac{T \times T_{sc} tg(\alpha) \times N_d}{(R_U + R_D)} \quad (39)$$

The graphical depiction of the charge of capacitor C610 is represented on FIG. 8 by the area restricted by equation 7 from points A to B and time interval t0 to tn on the time scale.

By definition:

$$C = \frac{Q}{V_{inp}} \quad (40)$$

Now, by substituting the expression for the charge in equation (39) at the end of measurement period T (of FIG. 6C) to equation (40) we get:

$$C \cong \frac{T}{N_M \times n \times (R_U R_D)} \sum_{i=1}^{n} (N_{R(i)}) + \frac{T \times N_d}{N_M \times (R_U + R_D)} \quad (41)$$

or in simplified form:

$$C \cong A \times \sum_{i=1}^{n} (N_{R(i)}) + B \quad (42)$$

Where $N_{R(i)}$ is a number of system clocks counted during the time interval $\Delta TR(i)$.

Consequently:

$$\sum_{i=1}^{n} (N_{R(i)})$$

is the sum of counted $N_{R(i)}$ for the period of measurement T. A and B are constants defined as:

$$A = \frac{T}{N_M \times n \times (R_U + R_D)} \quad (43)$$

$$B = \frac{T \times N_d}{N_M \times (R_U + R_D)} \quad (44)$$

For configurable controller applications requiring an estimate of the cable break location the known capacitance per cable unit length $C_L$ should be used to calculate the length of the cable connected to the specific input pin 210.

As the capacitance per unit length is assumed to be constant, the distance to the break location is estimated:

$$L = \frac{C_X}{C_L} \quad (46)$$

Where $C_X$ is measured capacitance on the specific input pin.

For practical purposes the cable length L can be expressed in cm or meter values or in segments of a harness subdivided by connectors.

The described methods of capacitance value measurements are limited on one hand for relatively large capacitances values (thousands of uF) e.g., values resulting in too long charging time, and on the other hand for low capacitance values (several pF) resulting in lower precision due to fast charging time.

Presently preferred applications of the capacitance measuring methods and cable breaks location are described hereinafter.

The first preferred application relates to the known in the art "machine diagnostics" mode used in industrial automation, wherein CEC (configurable electronic controller) modules are used in the machine for input measurements and output control.

Figure 10:
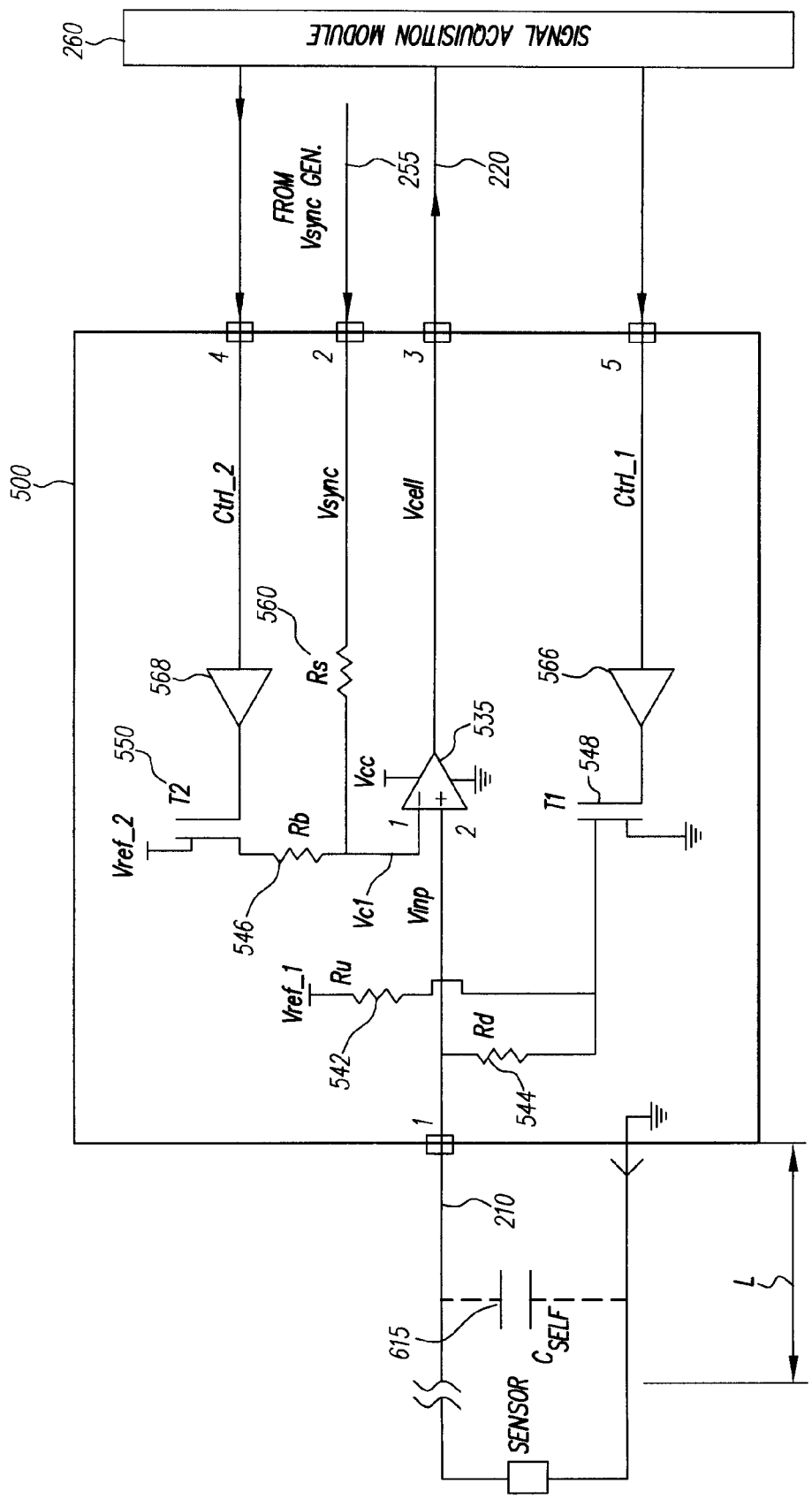
FIG. 10 is a schematic drawing of an adaptive input-cell circuitry, used in the present invention for measurements of the self-capacitance and length of an open conductor.

Most of the time, the CEC is expected to operate in its normal mode performing signal acquisition and control of the loads. The transition to diagnostics mode is enabled by digital unit 200 of FIG. 1 on startup of the specific machine or at any moment, for example on a failure event, such as an event causing an open ended cable, or disconnection of a sensor or group of sensors (as described in detail in WO 2006/008732). In this case, signal acquisition module 260 will detect the sensor disconnect location, utilizing one of the described embodiments of low capacitance value measurements. Choosing the low capacitance measurements method in this case is the result of the known in advance information about the self-capacitance of cables 615, wires or harness in question measured relative to ground, assuming a conductor length L of less than 8-10 meter, which represent capacitance values not exceeding 500 nF. This embodiment is represented as an example by FIG. 10.

If a configuration of signal acquisition module 260 supports the signal acquisition functions for normal mode operation only, then the other configuration of signal acquisition module 260 for capacitance measurements and cable break location diagnostics will be loaded separately, for example by a service center test device. When the configuration of signal acquisition module 260 contains both the signal acquisition and disconnect locating modules, only one of these may be enabled. In this case there is no need to reload programmable logic, just generate, by control logic module 370 of FIG. 1, the enable signals activating normal mode or diagnostics mode.

A second application relates to the normal operation mode of a configurable controller and more specifically to capacitance measurements as shown in FIG. 2. In case the range of capacitance values to be measured is known, it is appropriate to use one of the preferred measurements methods described above. In case the range of capacitance values to be measured is unknown, the measurement process should, for example, be performed in the following sequence:

Step (1)—The estimation begins by using a high capacitance measurement method, as described above.

Step (2)—The sum of counted system clocks in step (1), being indicative of the measured capacitance, is compared with a predetermined sum of counted system clocks corresponding to a pre-determined medium capacitance value, which was measured by both the high and low capacitance measurements methods.

If the counted system clocks in step (1) is less then the predetermined value than one more measurement using low capacitance measurement method should be done. If the counted system clocks in step (1) is equal or superior to the predetermined value then the result of measurement (1) is valid.

In the above-described embodiments, one or more switches have been described as transistor switches. It will be appreciated that any form of a electromagnetically controlled switch can be used including, but not limited to, a relay, an opto-coupler, a current controlled, or a voltage-controlled switch.

While the invention has been described with respect to preferred embodiments, it will be appreciated that this is set forth purely for purposes of example, and that many other variations, modifications and applications of the invention may be made.

PARTS LIST

| | |
|---|---|
| 200 | digital unit |
| 210 | input pin |
| 220 | output pin |
| 250 | synchronization signal generator |
| 255 | synchronization input |
| 260 | signal acquisition module |
| 270 | synchronization control module |
| 275 | sync data |
| 280 | output control logic modules |
| 290 | output reference data |
| 310 | high-side switch control |
| 320 | high-side switch |
| 330 | low-side switch control |
| 340 | low-side switch |
| 350 | high-side output drivers |
| 360 | low-side output drivers |
| 370 | control logic module |
| 380 | output pins |
| 500 | adaptive input-cell |
| 535 | comparator |
| 542 | resistor Ru |
| 544 | resistor Rd |
| 546 | resistor Rb |

-continued

PARTS LIST

| | |
|---|---|
| 548 | first electromagnetically controlled switch |
| 550 | second electromagnetically controlled switch |
| 560 | resistor Rs |
| 566 | buffer |
| 568 | buffer |
| 600 | configurable control system |
| 610 | capacitor |
| 615 | cables |
| Ctrl_1 | first control signal |
| Ctrl_2 | second control signal |
| Vcell | output voltage |
| Vc1 | reference voltage |
| Vinp | input voltage |
| Vref_1 | source of first voltage reference |
| Vref_2 | source of second voltage reference |
| Vsync | synchronization voltage |

The invention claimed is:

1. An apparatus for measurement of capacitance by an input-cell, said input-cell comprising:

a comparator having a first input and a second input, said capacitance connected between said first input and a ground;

a first resistor and a second resistor connected in series between a first voltage reference source and said first input;

a first switch connected to the first resistor, the second resistor and the ground, said first switch adapted to receive a first control signal from a first control line and to switch between an open state and a closed state in response to the first control signal with the first resistor, the second resistor and the first switch being adapted to provide charging and discharging to said capacitance when the first switch is open and when the first switch is closed respectively;

a third resistor and fourth resistor connected in series between a second voltage reference source, a second switch and a waveform input line, said third resistor and fourth resistor connected to said second input;

said second switch being adapted to receive a second control signal from a second control line and to transition between an open state and a closed state based upon a second control signal to switch the second input between said waveform input signal and a biased and attenuated waveform input signal when the second switch is open and when the second switch is closed respectively; and a system clock used to synchronize at least said waveform input, the first control signal and the second control signal;

wherein said comparator is adapted to generate a signal at an output that indicates whether an amplitude of a signal at the first input is greater than an amplitude of a signal at the second input; and wherein said first control signal initiates at least one charge and discharge cycle of said capacitance; and wherein said generated output signal is measured by a cumulative count of said system clock and is indicative of a value of the capacitance.

2. The apparatus for measurement of capacitance by an input-cell of claim 1, wherein said first control signal and said second control signal define a first configuration of said input-cell and a second configuration of said input-cell.

3. The apparatus for measurement of capacitance by an input-cell of claim 2, wherein first switch and second switch can be used to configure said input-cell to enable measurement of at least one of a range of high capacitance values and at least one of a range of low capacitance values.

4. The apparatus for measurement of capacitance by an input-cell of claim 3, wherein said one of a range of high capacitance values is more than about 200 nf and said at least one of a range of low capacitance values is less than about 500 nf.

5. The apparatus for measurement of capacitance by an input-cell of claim 1, wherein a measured capacitance represents a length of an open-ended conductor connected to said input-cell.

6. A method for measurement of capacitance values, comprising:
  a) providing a configurable input-cell, said input-cell comprising of a comparator having a first input and a second input, said capacitance connected between said first input and a ground; a first resistor and a second resistor connected in series between a first voltage reference source and said first input, a first switch connected to said first resistor, said second resistor and the ground; a third resistor and a fourth resistor connected in series between a second voltage reference source, a second switch and a waveform input line, said third resistor and fourth resistor connected to said second input;
  b) defining a first measurement configuration and a second measurement configuration of said input-cell by provision of a first control signal to said first switch and a second control signal to said second switch;
  c) providing a system clock to synchronize at least said waveform input and said first control signal and said second control signal;
  d) initiating, by said first control signal at least one charge and discharge cycle of said capacitance; and
  e) measuring at least one of high capacitance values and low capacitance values by said first measurement configuration and said second measurement configuration;
  wherein the output signal of said comparator is measured by a cumulative count of said system clock and is indicative of a value of said capacitance.

7. The method for measurement of capacitance values of claim 6, wherein said high capacitance value is more than 200 nf and said low capacitance value is less than 500 nf.

8. A configurable controller comprising:
  a system clock;
  at synchronization control module;
  a plurality of configurable signal acquisition modules connected with said synchronization control module;
  a control logic connected with said plurality of signal acquisition modules;
  a plurality of input-cells respectively connected with said plurality of signal acquisition modules and with a respective plurality of input pins; and
  a synchronization signal generator connected with said synchronization control module and with said plurality of input-cells, wherein each one of said plurality of input-cells is operable to convert input signal parameters to time-based parameters; and wherein each of said signal acquisition modules is configured to convert said time-based parameters to a digital form, the input-cell comprising:
  at least one of a sensor output signal and a capacitance connected to one of said input pins;
  a comparator having a first input and a second input, said first input connected to the input pin that is connected to the capacitance, and an output signal connected to one of the plurality of signal acquisition modules;
  a first transistor switch;
  a second transistor switch; and
  resistor networks respectively connected to said first input, to the input pin that is connected to the capacitance, to said second input, and to said first and second transistor switches;
  wherein said first transistor switch can be configured by said signal acquisition module to form one of a pull-up and a pull-down for a sensor output signal received from the input pin; and
  wherein said first transistor switch can be configured by said signal acquisition module to initiate at least one charge and discharge cycle of said capacitance; and
  wherein said second transistor switch can be configured by said signal acquisition module to connect said second input to one of a second voltage reference source and an input waveform from said synchronization signal generator; and
  wherein the generated output signal of said comparator is indicative of at least one of said sensor output signal and a value of said capacitance.

9. The input-cell of claim 8, wherein said input-cell is operable to convert said sensor output signal to time-based parameters; and wherein each of said signal acquisition modules is configured to convert said time-based parameters to a digital form.

10. The input-cell of claim 8, wherein said generated output signal is measured by a cumulative count of said system clock and is indicative of the value of said capacitance.

11. A method of acquiring a plurality of signals and measuring capacitance comprising the steps of providing:
  a system clock;
  a synchronization control module, configuring a plurality of configurable signal acquisition modules connected with said synchronization control module;
  a control logic connected with said plurality of signal acquisition modules, providing a plurality of input-cells respectively connected with said plurality of signal acquisition modules; and
  a synchronization signal generator connected with said plurality of input-cells, acquiring input signals from sensors and charged capacitance, said input signals acquired by one of said plurality of input-cells, converting said acquired input signals into a plurality of time-based parameters, converting said plurality of time-based parameters into a digital form, wherein said converting of said acquired input signals into a plurality of time-based parameters is controlled by a first transistor switch and a second transistor switch comprised in said input-cells and wherein said signal acquisition module connected to one of said input-cells is configured to control said first and second transistor switches of the one of said input-cells according to at least one of a type of parameters characterizing an input signal at the input-cell and a value of a measured capacitance, acquired by the input-cells.

12. The method of claim 11, wherein said configured control of said first and second transistor switches further determines the way in which said steps of converting said acquired input signals into time-based parameters and converting said time-based parameters into a digital form are performed.

* * * * *